(12) United States Patent
Haga et al.

(10) Patent No.: US 10,068,871 B2
(45) Date of Patent: Sep. 4, 2018

(54) SEMICONDUCTOR DEVICE AND METHOD FOR MANUFACTURING THE SAME

(71) Applicant: ROHM CO., LTD., Kyoto (JP)

(72) Inventors: Motoharu Haga, Kyoto (JP); Kaoru Yasuda, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/479,887

(22) Filed: Apr. 5, 2017

(65) Prior Publication Data

US 2017/0294400 A1 Oct. 12, 2017

(30) Foreign Application Priority Data

Apr. 12, 2016 (JP) ................. 2016-079856

(51) Int. Cl.
| | |
|---|---|
| H01L 23/48 | (2006.01) |
| H01L 23/00 | (2006.01) |
| H01L 23/31 | (2006.01) |
| H01L 23/492 | (2006.01) |
| H01L 23/498 | (2006.01) |

(52) U.S. Cl.
CPC .......... *H01L 24/43* (2013.01); *H01L 23/3157* (2013.01); *H01L 23/492* (2013.01); *H01L 23/498* (2013.01); *H01L 23/49894* (2013.01); *H01L 23/562* (2013.01); *H01L 24/08* (2013.01); *H01L 24/27* (2013.01); *H01L 24/48* (2013.01); *H01L 2224/27462* (2013.01); *H01L 2924/01013* (2013.01); *H01L 2924/01029* (2013.01)

(58) Field of Classification Search
CPC ............... H01L 23/3157; H01L 23/492; H01L 23/49894; H01L 24/08
USPC .................................................. 257/773, 786
See application file for complete search history.

(56) References Cited

U.S. PATENT DOCUMENTS

| | | | | |
|---|---|---|---|---|
| 5,656,863 A * | 8/1997 | Yasunaga | ............... | H01L 21/565 257/778 |
| 5,962,919 A * | 10/1999 | Liang | ...................... | H01L 24/05 257/748 |
| 7,327,031 B2 * | 2/2008 | Takewaki | ................ | H01L 24/03 257/737 |
| 7,508,082 B2 * | 3/2009 | Takewaki | ................ | H01L 24/03 257/750 |
| 2003/0102475 A1* | 6/2003 | Kwon | ..................... | H01L 24/03 257/48 |
| 2006/0065969 A1* | 3/2006 | Antol | .................. | H01L 23/3171 257/700 |
| 2014/0284790 A1 | 9/2014 | Matsumoto et al. | | |

(Continued)

FOREIGN PATENT DOCUMENTS

JP 2014-187073 A 10/2014

*Primary Examiner* — Nitin Parekh
(74) *Attorney, Agent, or Firm* — Rabin & Berdo, P.C.

(57) ABSTRACT

A semiconductor device includes a semiconductor substrate with a wiring layer formed thereon, an insulating film formed on the semiconductor substrate so as to cover the wiring layer and having a pad opening exposing a portion of the wiring layer as a pad, a front surface protection film formed on the insulating film and being constituted of an insulating material differing from the insulating film and having a second pad opening securing exposure of at least a portion of the pad, a seed layer formed on the pad, and a plating layer formed on the seed layer.

13 Claims, 10 Drawing Sheets

(56) References Cited

U.S. PATENT DOCUMENTS

2016/0233189 A1\* 8/2016 Shimote ............ H01L 23/49827
2016/0268222 A1 9/2016 Matsumoto et al.

\* cited by examiner

SEMICONDUCTOR DEVICE AND METHOD FOR MANUFACTURING THE SAME

CROSS-REFERENCE TO RELATED APPLICATIONS

The present application corresponds to Japanese Patent Application No. 2016-79856 filed in the Japan Patent Office on Apr. 12, 2016, and the entire disclosure of this application is incorporated herein by reference.

TECHNICAL FIELD

The present invention relates to a semiconductor device and a method for manufacturing the same.

BACKGROUND ART

For example, Patent Document 1 (Japanese Patent Application Publication No. 2014-187073) discloses a semiconductor device, including a first insulating film formed on a major surface of a semiconductor substrate, an electrode pad formed on the first insulating film and constituted of an alloy film with Cu added, a second insulating film formed on the major surface of the semiconductor substrate so as to cover a portion of an upper surface of the electrode pad, a first opening portion formed in the second insulating film and exposing a portion of the upper surface of the electrode pad, a plating film electrically connected to the electrode pad via the first opening portion, and a plating adhesion film formed on an upper surface of the plating film, and with which a concentration of the Cu added to the alloy film constituting the electrode pad is not less than 2 wt %. In the semiconductor device, the plating film is formed by an electroless plating method.

SUMMARY OF INVENTION

The electroless plating method has such shortcomings as being high in cost, requiring extreme care in management of a plating solution because plating is performed by a chemical change, etc. Also with electroless plating, a front surface of an object to be plated must be pretreated (for example, subject to zincate treatment, etc.) prior to plating and there are cases where a problem occurs in a pad due to the pretreatment. For example, when an Al pad is subject to zincate treatment, a spike (micropore) forms at a position directly above a via in the Al pad and consequently, a cavity in the plating layer may form inside the spike.

A preferred embodiment of the present invention thus provides a semiconductor device, which is low in cost and enables satisfactory conduction reliability of a pad to be secured, and a method for manufacturing the semiconductor device.

A semiconductor device according to a preferred embodiment of the present invention includes a semiconductor substrate with a wiring layer formed thereon, an insulating film formed on the semiconductor substrate so as to cover the wiring layer and having a pad opening exposing a portion of the wiring layer as a pad, a front surface protection film formed on the insulating film and being constituted of an insulating material differing from the insulating film and having a second pad opening securing exposure of at least a portion of the pad, a seed layer formed on the pad, and a plating layer formed on the seed layer.

Also, a method for manufacturing a semiconductor device according to a preferred embodiment of the present invention includes a process of forming, on a semiconductor substrate on which a wiring layer is formed, an insulating film so as to cover the wiring film, a process of selectively removing the insulating film to form a pad opening that exposes a portion of the wiring layer as a pad, a process of forming, on the insulating film, a front surface protection film constituted of an insulating material differing from the insulating film, a process of selectively removing the front surface protection film to form a second pad opening that secures exposure of at least a portion of the pad, a process of forming a seed layer on the pad, and a process of growing a plating layer from the seed layer by electroplating.

Advantageous Effects of Invention

With the preferred embodiment of the present invention, the plating layer is formed by electroplating and therefore the cost required to form the plating layer can be reduced. Also, there is no need to pretreat the pad, which is the object to be plated, prior to plating and therefore occurrence of a problem in the pad can be prevented as well. The semiconductor device according to the preferred embodiment of the present invention, which is low in cost and enables satisfactory conduction reliability of the pad to be secured, can thus be provided.

DESCRIPTION OF PREFERRED EMBODIMENTS

Figure 1:
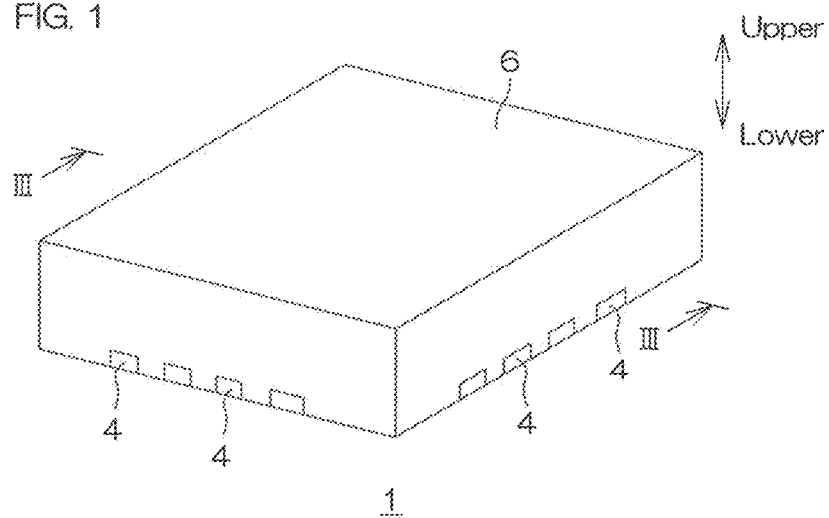
FIG. 1 is a schematic perspective view (upper surface side) of a semiconductor device according to a preferred embodiment of the present invention.
Figure 2:
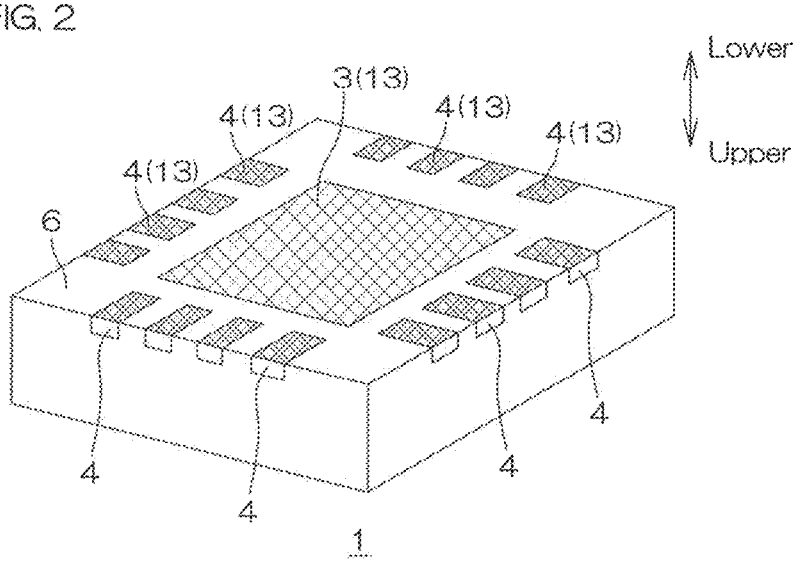
FIG. 2 is a schematic perspective view (lower surface side) of the semiconductor device according to the preferred embodiment of the present invention.
Figure 3:
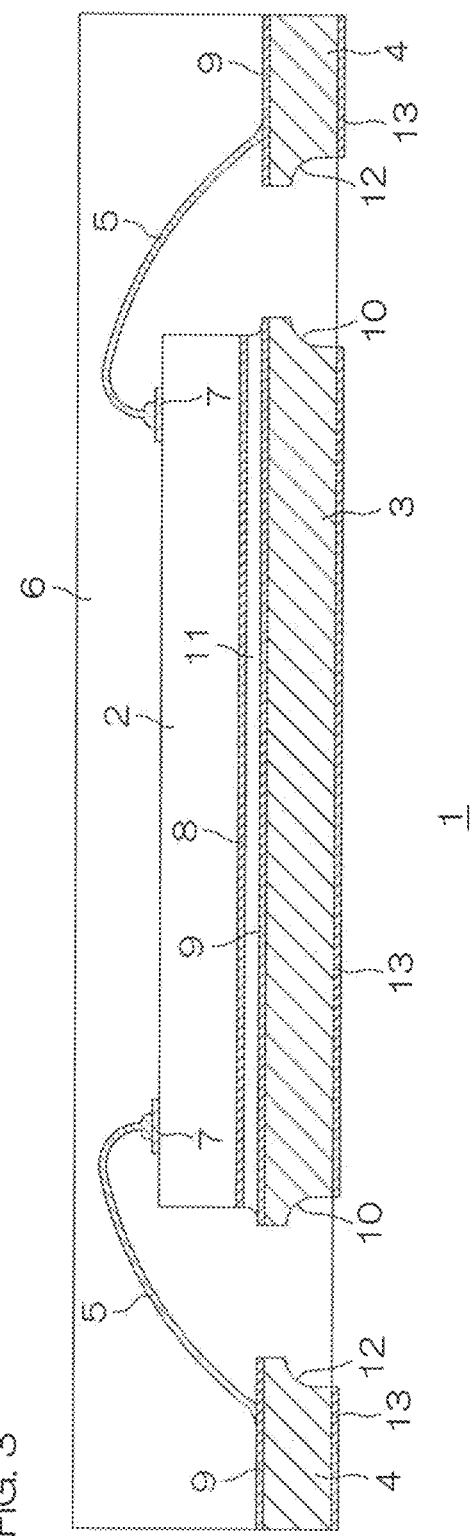
FIG. 3 is a sectional view taken along section line of FIG. 1.

Preferred embodiments of the present invention shall now be described in detail with reference to the attached drawings. FIG. 1 is a schematic perspective view (upper surface side) of a semiconductor device 1 according to a preferred embodiment of the present invention. FIG. 2 is a schematic perspective view (lower surface side) of the semiconductor device 1 according to the preferred embodiment of the present invention. FIG. 3 is a sectional view taken along section line of FIG. 1.

The semiconductor device 1 is a semiconductor device to which a QFN (Quad Flat Non-leaded package) is applied. The semiconductor device 1 has a structure where a semiconductor chip 2 is sealed, together with an island 3, leads 4, and wires 5, in a resin package 6. An outer shape of the semiconductor device 1 (resin package 6) is a flat, rectangular parallelepiped shape.

The semiconductor chip 2 is formed to a quadrilateral shape in plan view and has a plurality of pads 7 at peripheral edge portions of an upper surface. Although not shown, the plurality of pads 7 are aligned, for example, annularly at equal intervals along peripheral edges of the semiconductor chip 2. Obviously, the plurality of pads 7 may be provided only at each of a pair of peripheral edge portions corresponding to a pair of opposing sides of the semiconductor chip 2. A rear metal 8, constituted of a metal material, such as Au, Ni, Ag, etc., is formed on a rear surface of the semiconductor chip 2. The semiconductor chip 2, in an orientation where the upper surface, at which the pads 7 are disposed, is faced upward, and is bonded via a bonding material 11 to the island 3. For example, a solder paste is used as the bonding material 11. More specifically, the rear metal 8 of the semiconductor chip 2 and a plating layer 9 (to be described below) of the island 3 may be bonded by eutectic bonding using a solder paste.

The island 3 and the leads 4 are formed by punching out a metal thin plate (for example, a copper thin plate). Plating layers 9, constituted, for example, of a metal material, such as Au, Ni, Ag, etc., are formed on front surfaces of the island 3 and the leads 4.

The island 3 is formed to a quadrilateral shape in plan view and is disposed at a central portion of the semiconductor device 1 so that its respective side surfaces are parallel to side surfaces of the semiconductor device 1.

Across an entire periphery of a peripheral edge portion of a rear surface of the island 3, a recess 10 is formed by crushing from the rear surface side. The recess 10 is formed, for example, to a substantially ¼ elliptical shape in sectional view and a portion of the resin package 6 enters thereinto. A peripheral edge portion of the island 3 is thereby sandwiched from above and below by the resin package 6 and the island 3 is prevented from falling off from (is retained in) the resin package 6.

Also, a portion of the rear surface of the island 3 excluding the recess 10 is exposed from a rear surface of the resin package 6.

An equal number (four, in the present preferred embodiment) of the leads 4 are provided at each of positions facing the respective side surfaces of the island 3. Each lead 4 is formed to an elongate oblong shape in plan view that extends in an intersecting direction (an orthogonal direction, in the present preferred embodiment) with respect to a side surface of the island 3. Obviously, each lead 4 does not have to be of an oblong shape that is long in the intersecting direction and may be of an oblong shape, with which the intersecting direction is a width direction, or may be of a square shape. The plurality of leads 4 are aligned at equal intervals in directions parallel to the side surfaces of the island 3.

At an end portion at the island 3 side of a rear surface of each lead 4, a recess 12 is formed by crushing from the rear surface side. Each recess 12 is formed, for example, to a substantially ¼ elliptical cross-sectional shape and a portion of the resin package 6 enters thereinto. The end portion at the island 3 side of each lead 4 is thereby sandwiched from above and below by the resin package 6 and the lead 4 is prevented from falling off from (is retained in) the resin package 6.

A portion of the rear surface of each lead 4 excluding the recess 12 is exposed from the rear surface of the resin package 6. On the other hand, a side surface of the lead 4 at the side opposite the island 3 side is exposed, in a bare surface state, from a side surface of the resin package 6. That is, each lead 4 exposed from a side surface of the resin package 6 does not have a plating layer or other coating film or thin film formed thereon and is exposed, as it is in a state of the material constituting a main body of the lead 4, from the resin package 6.

Plating layers 13, constituted, for example, of solder or other metal material, are formed on portions (rear surfaces) of the island 3 and the leads 4 that are exposed from the resin package 6. In FIG. 2, plated portions (plating layers 13) are provided with cross hatching to distinguish between the plated portions and non-plated portions of the island 3 and the leads 4 exposed from the resin package 6.

If electrical connection of the semiconductor chip 2 and the island 3 is unnecessary, the rear metal 8 may be omitted and the semiconductor chip 2 may be bonded to the island 3 via a bonding material, constituted of an insulating paste, etc. In this case, the plating layer 9 on the front surface of the island 3 may be omitted.

Although in the present preferred embodiment, the wires 5 are constituted of so-called Cu wires having Cu as a main component (for example, with a purity of Cu being not less than 99.99%), Au wires or Al wires may be used as modification examples. The wires 5 connect the pads 7 of the semiconductor chip 2 with the leads 4.

Each of FIG. 4 to FIG. 9 is an enlarged view of a vicinity of a pad 7 of the semiconductor chip 2. The pad structure of the semiconductor chip 2 shall now be described more specifically with reference to each of FIG. 4 to FIG. 9. The pad structures described with these preferred embodiments are mainly related to a structure of a plating layer above an Al pad. The plating layer contributes to resolution of the following issues (1) to (3) that may arise, for example, in a semiconductor device to which an Al pad-Cu wire bonding is applied.

(1) Short circuit failure due to pad crack
(2) Open failure due to alloy growth during a high temperature storage test
(3) Open failure due to corrosion of a bonded portion during testing by a highly accelerated temperature and humidity stress test (HAST) or a pressure cooker test (PCT)

Figure 4:
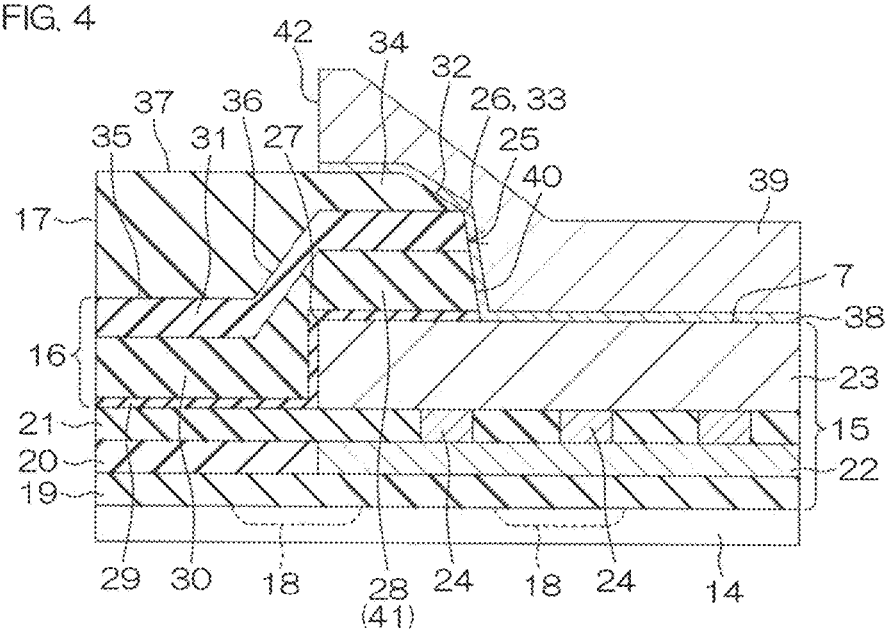
FIG. 4 is a diagram for describing a pad structure of a semiconductor chip.

Referring to FIG. 4, a semiconductor chip 2 (not shown) includes a semiconductor substrate 14, a multilayer wiring structure 15, an insulating film 16, and a front surface protection film 17.

As the semiconductor substrate 14, a known substrate, for example, an Si substrate, an SiC substrate, or a GaN substrate, etc., may be applied. Semiconductor elements 18, such as a MOSFET, diode, etc., are formed on a front surface of the semiconductor substrate 14.

The multilayer wiring structure 15 is a wiring layer that is electrically connected to the semiconductor elements 18 and includes a plurality of insulating films and wiring layers. In the present preferred embodiment, the multilayer wiring structure 15 has a first insulating layer 19, a second insulating layer 20, and a third insulating layer 21 and has, as wiring layers, a first wiring layer 22 and a second wiring layer 23, which is an example of a wiring layer of the present invention.

The first wiring layer 22 is formed in a predetermined pattern on the first insulating layer 19, and the second wiring layer 23 is formed in a predetermined pattern on the third insulating layer 21. The first wiring layer 22 and the second wiring layer 23 are connected to each other by a plurality of vias 24 penetrating through the second insulating layer 20. Also, the first wiring layer 22 may be connected to the semiconductor element 18 by another unillustrated wiring layer or via, etc. On the other hand, the second wiring layer 23 is formed as an uppermost layer wiring of the multilayer wiring structure 15 and in a region of the second wiring layer 23 other than a wiring pattern, a portion of the third insulating layer 21 may be exposed as an uppermost layer insulating layer. The number of layers of the multilayer wiring structure 15 is merely an example for describing the preferred embodiment of the present invention and may be greater than or less than the number of layers shown in FIG. 4. Further, as a wiring structure of the semiconductor chip 2, a structure of only an uppermost layer wiring layer, disposed on the semiconductor substrate 14 across an insulating film, may be applied.

The first insulating layer 19, the second insulating layer 20, and the third insulating layer 21 may be constituted, for example, of $SiO_2$ or other insulating material and may be formed by a known method, such as a CVD method, etc.

Although in the present preferred embodiment, the first wiring layer 22 and the second wiring layer 23 are Al wiring layers, these may be wiring layers constituted of other metal materials. Also, the first wiring layer 22 and the second wiring layer 23 do not have to be formed of the same material. For example, the second wiring layer 23 that is the uppermost layer may be formed as an Al wiring layer and lower wiring layers, including the first wiring layer 22 may be arranged as Cu damascene wiring. The plurality of vias 24 may be constituted, for example, of a metal material, such as tungsten, etc.

Also, it is preferable for the second wiring layer 23 to have a thickness, for example, of 20000 Å to 30000 Å in consideration of impact during bonding of the wires 5.

The insulating film 16 is disposed so as to cover the upper surface region of the third insulating layer 21 that includes the second wiring layer 23. A pad opening 25, which exposes a portion of the second wiring layer 23 as a pad 7, is opened in the insulating film 16. A portion of the insulating film 16 may ride over the second wiring layer 23 as an overlap portion 28 so that an outer edge 26 of the pad opening 25 is disposed further inward than an outer edge 27 of the second wiring layer 23. The remaining portion of the insulating film 16 other than the overlap portion 28 may be closely adhered to the third insulating layer 21 and provided as a main body portion 35. The overlap portion 28 and the main body portion 35 of the insulating film 16 are made continuous via a step portion 36 based on a height difference due to the thickness of the second wiring layer 23.

Also, although in the present preferred embodiment, the insulating film 16 is constituted of SiN, it may be constituted of another insulating material instead. Also, the insulating film 16 may have, for example, a laminated structure of a plurality of SiN films. Specifically, the insulating film 16 may include a liner silicon nitride film 29 as a lower layer, an intermediate HDP (High Density Plasm) silicon oxide film 30, and a front surface silicon nitride film 31. The liner silicon nitride film 29 may be the thinnest, the front surface silicon nitride film 31 may be second in thinness, and the HDP silicon oxide film 30 may be the thickest. By making the HDP silicon oxide film 30 be the thickest, the insulating film 16 can be improved in film quality as a whole.

A thickness of the insulating film 16 may, for example, be 20000 Å to 40000 Å. More specifically, the liner silicon nitride film 29 may be present or not present and if present, a thickness thereof may be 2000 Å to 3000 Å, a thickness of the HDP silicon oxide film 30 may be 2000 Å to 23000 Å, and a thickness of the front surface silicon nitride film 31 may be 10000 Å to 25000 Å.

The front surface protection film 17 is laminated on the insulating film 16. A second pad opening 32, which at least secures exposure of the pad 7, is formed in the front surface protection film 17. A portion of the front surface protection film 17 may ride over an upper surface region of the second wiring layer 23 as an overlap portion 34 so that an outer edge 33 of the second pad opening 32 and the outer edge 26 of the pad opening 25 are matched in FIG. 4. With the present preferred embodiment, the overlap portion 34 of the front surface protection film 17 may be referred to as a peripheral edge portion 43 of the second pad opening 32. The remaining portion of the front surface protection film 17 other than the overlap portion 34 may be closely adhered to the insulating film 16 and provided as a main body portion 37. Also, in a region above the step portion 36 of the insulating film 16, the front surface protection film 17 is formed to decrease in thickness in a direction of approaching the second wiring layer 23. The front surface protection film 17 thereby absorbs the height difference at the step portion 36 and has a flat surface of fixed height across regions above the main body portion 35, the step portion 36, and the overlap portion 28 of the insulating film 16.

Also, the front surface protection film 17 is constituted of an insulating material differing from the insulating film 16 and is constituted, for example, of polyimide. The front surface protection film 17 may be constituted of an insulating material other than polyimide. A thickness of the front surface protection film 17 may, for example, be 3.5 μm to 5.5 μm.

A plating layer 39 is formed across a seed layer 38 above the pad 7. In the present preferred embodiment, the seed layer 38 is provided across an entirety of a lower surface of the plating layer 39. That is, the seed layer 38 and the plating layer 39 have a mutually flush plating end surface 42. In a direction along the front surface of the semiconductor substrate 14, the plating end surface 42 may be disposed, for example, at a position matching the outer edge 27 of the second wiring layer 23.

In FIG. 4, the seed layer 38 is formed to cover, not only a front surface of the pad 7 but also a side surface 40 of the pad opening 25 and a peripheral edge portion 41 of the pad opening 25. In FIG. 4, the overlap portion 28 of the insulating film 16 and the peripheral edge portion 41 are of the same arrangement.

The plating layer 39 is a metal layer arranged by plating growth from the seed layer 38 and, in the semiconductor chip 2, is a portion to which the corresponding wire 5, shown in FIG. 3, is bonded. As with the seed layer 38, the plating layer 39 extends outward from the pad opening 25 to an upper surface region of the peripheral edge portion 41 of the insulating film 16. In the present preferred embodiment, the outer edge 33 of the second pad opening 32 and the outer edge 26 of the pad opening 25 are matched and the insulating film 16 is covered completely by the front surface protection film 17 and therefore the plating layer 39 and the seed layer 38 are formed so as to contact an upper surface of the front surface protection film 17.

The seed layer 38 is constituted, for example, of Cu or An, etc., and the plating layer 39 may have a laminated structure, for example, in which Ni, Pd, and Au are laminated in that order. Also, the plating layer 39 may have a laminated structure of Ni and Pd with Au being omitted. Also, a thickness of the seed layer 38 may, for example, be 500 Å to 15000 Å. A thickness of the plating layer 39 may, for example, be 2.11 µm to 5.35 µm in entirety, with the Ni layer being 2 µm to 5 µm, the Pd layer being 0.1 µm to 0.3 µm, and the Au layer being 0.01 µm to 0.05 µm.

Although pad structures of semiconductor chips 2 shall now be described with reference to FIG. 5 to FIG. 9, description shall be omitted for arrangements in common to FIG. 4.

Figure 5:
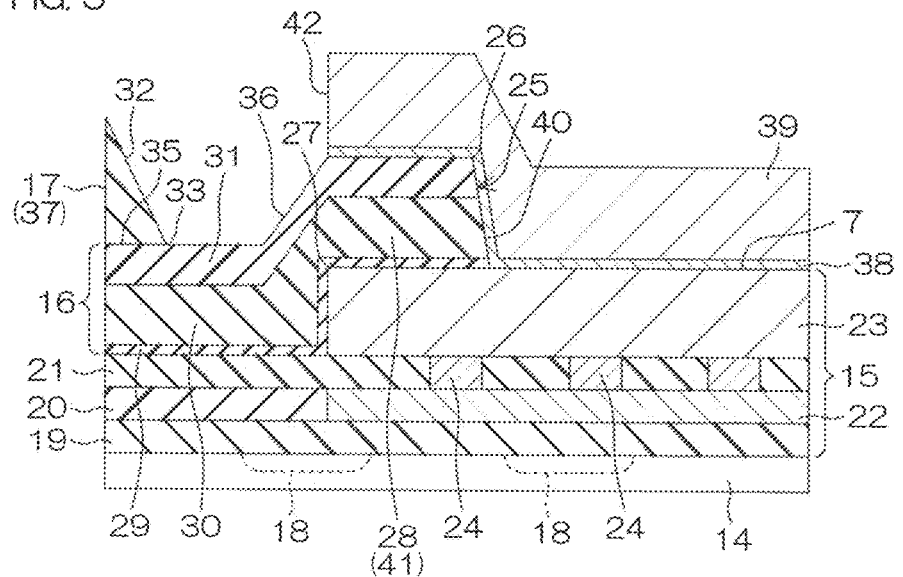
FIG. 5 is a diagram for describing a pad structure of a semiconductor chip.

In FIG. 5, the outer edge 33 of the second pad opening 32 of the front surface protection film 17 is disposed further outward than the outer edge 26 of the pad opening 25 of the insulating film 16. A portion of an upper surface of the insulating film 16 is thereby exposed between the outer edge 26 of the pad opening 25 and the outer edge 33 of the second pad opening 32.

In the present preferred embodiment, the plating layer 39 is formed in close adhesion to the insulating film 16 so as to cover the overlap portion 28 (peripheral edge portion 41) of the insulating film 16. In other words, in an inner region of the second pad opening 32, the plating layer 32 is disposed across an interval from the outer edge 33 of the second pad opening 32. The step portion 36 and a portion of the main body portion 35 of the insulating film 16 are thereby exposed between the plating layer 39 and the front surface protection film 17.

Figure 6:
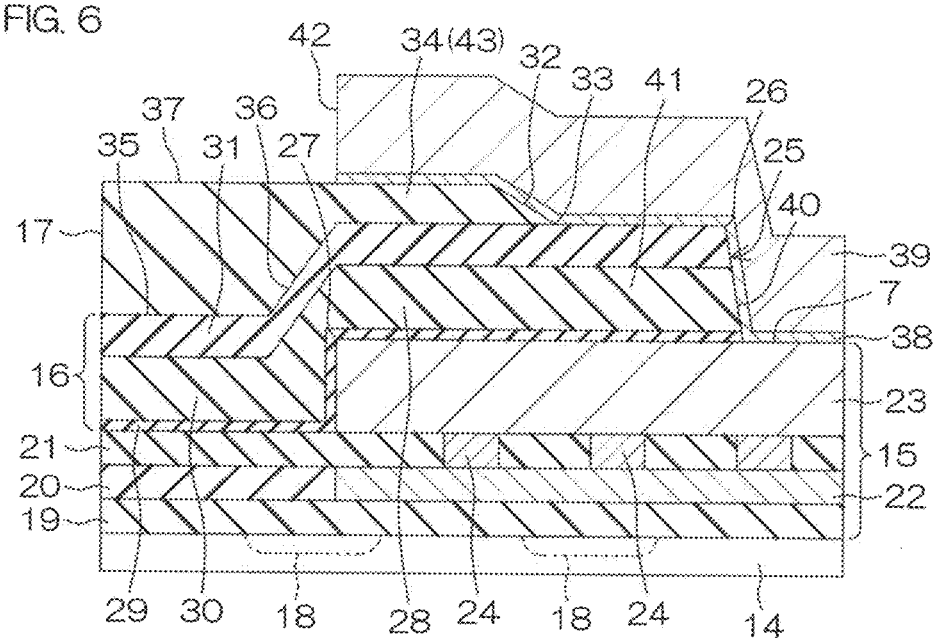
FIG. 6 is a diagram for describing a pad structure of a semiconductor chip.

In FIG. 6, although the outer edge 33 of the second pad opening 32 is disposed further outward than the outer edge 26 of the pad opening 25 as in FIG. 5, the front surface protection film 17 is formed to cover the main body portion 35, the step portion 36, and a portion of the overlap portion 28 of the insulating film 16. The front surface protection film 17 thereby exposes the peripheral edge portion 41 of the pad opening 25.

In the present preferred embodiment, the plating layer 39 is formed continuously above the peripheral edge portion 41 of the pad opening 25 and the peripheral edge portion 43 (overlap portion 34) of the second pad opening 32.

Figure 7:
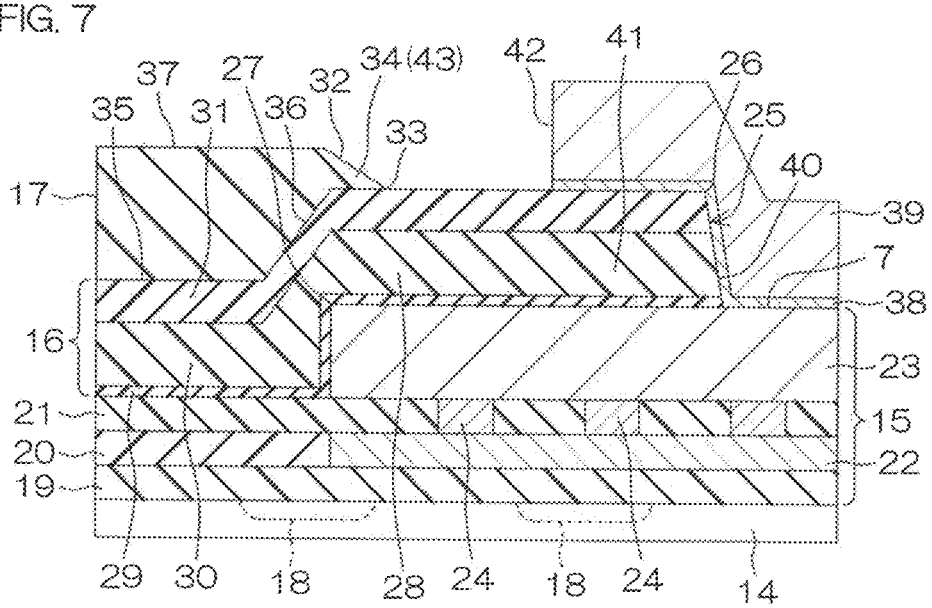
FIG. 7 is a diagram for describing a pad structure of a semiconductor chip.

In FIG. 7, the plating end surface 42 of the seed layer 38 and the plating layer 39 is disposed further inward than the outer edge 27 of the second wiring layer 23 in the structure shown in FIG. 6. The plating layer 39 is thereby formed to a size fitting within the upper surface region of the second wiring layer 23 and a portion of the second wiring layer 23 is in a state of projecting further outward than the plating end surface 42.

Also, in the inner region of the second pad opening 32, the plating layer 39 is disposed across an interval from the outer edge 33 of the second pad opening 32.

Figure 8:
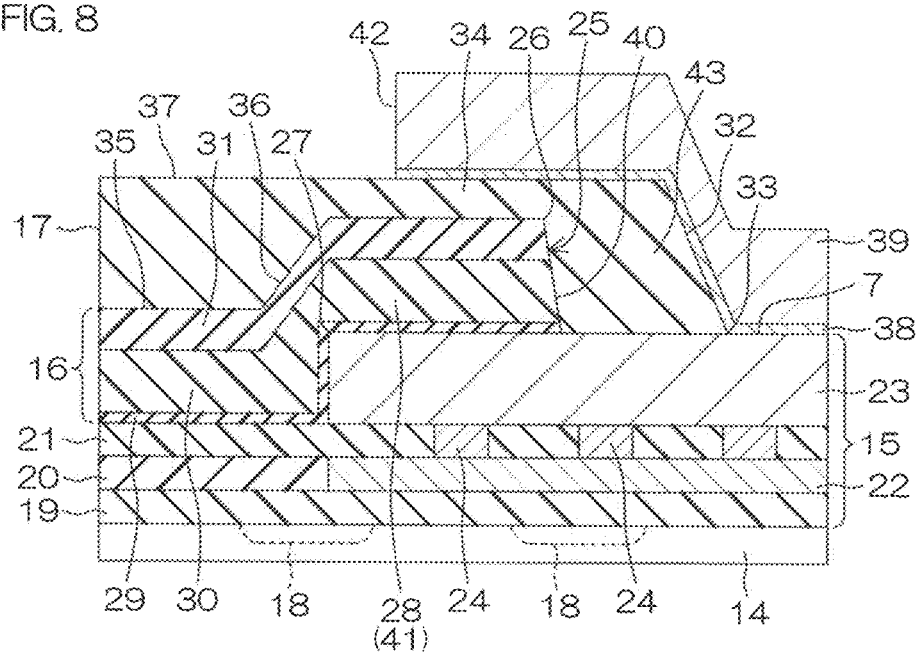
FIG. 8 is a diagram for describing a pad structure of a semiconductor chip.

In FIG. 8, the front surface protection film 17 is disposed between the insulating film 16 and the plating layer 39 and further covers the side surface 40 of the pad opening 25 in the structure of FIG. 7. That is, the peripheral edge portion 43 of the front surface protection film 17 is provided at an inward side of the pad opening 25. The outer edge 33 of the second pad opening 32 is thereby disposed further inward than the outer edge 26 of the pad opening 25.

In the present preferred embodiment, the plating layer 39 is formed to cover upper surface regions of the peripheral edge portion 43 of the front surface protection film 17 and the peripheral edge portion 41 of the insulating film 16.

Figure 9:
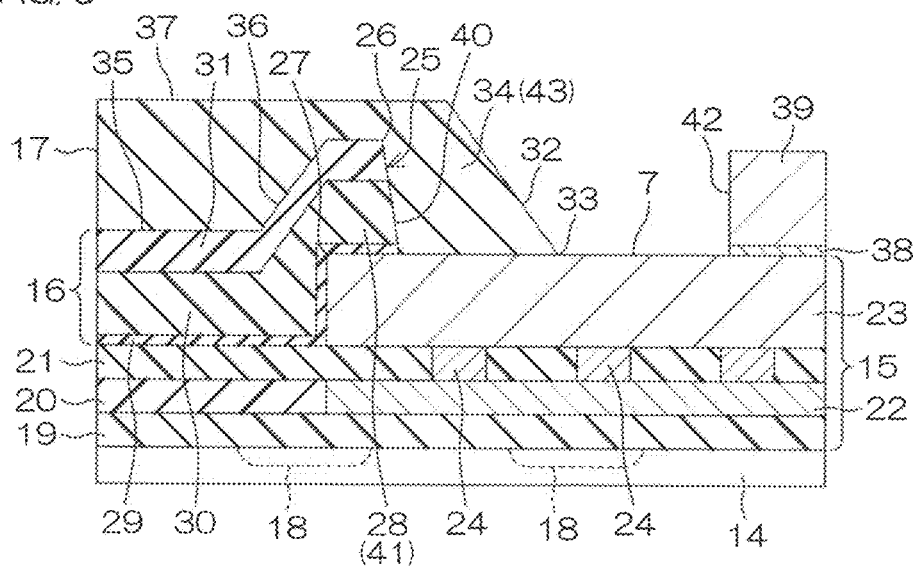
FIG. 9 is a diagram for describing a pad structure of a semiconductor chip.
Figure 10:
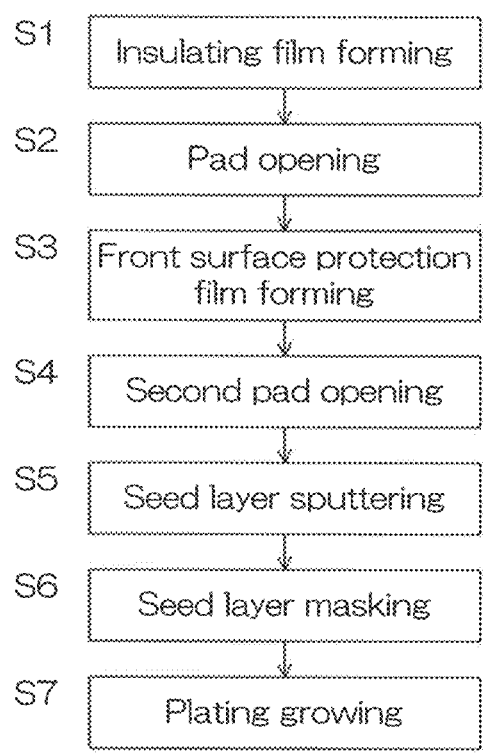
FIG. 10 is a flow diagram of a portion of a manufacturing process of the semiconductor chip.

In FIG. 9, the plating layer 39 is disposed in the inner region of the second pad opening 32 and across an interval from the outer edge 33 of the second pad opening 32 in the structure of FIG. 8. A portion of a bare surface of the pad 7 is thereby exposed between the plating end surface 42 of the plating layer 39 and the outer edge 33 of the second pad opening 32.

FIG. 10 and FIGS. 11A to 11G are diagrams showing portions of a manufacturing process of the semiconductor chip 2 in the order of process. In FIGS. 11A to 11G, only the arrangement, which, among the arrangements shown in FIG. 4 to FIG. 9, is necessary for describing a method for manufacturing the semiconductor chip 2 is shown. Also, although in FIGS. 11A to 11G, the manufacturing process for the structure of FIG. 4 as a representative example among FIG. 4 to FIG. 9 is shown, the structures shown in FIG. 5 to FIG. 9 can be manufactured in a manner similar to the structure of FIG. 4 by changing mask patterns for forming the insulating film 16, the front surface protection film 17, and the plating layer 39.

Figure 11A:
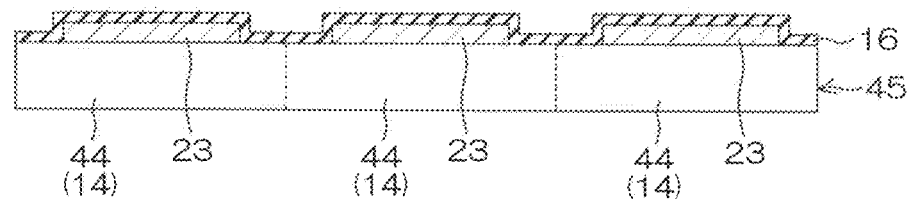
FIGS. 11A to 11G are diagrams, each showing a portion of the manufacturing process of the semiconductor chip.

First, as shown in FIG. 11A, a semiconductor wafer 45, having a plurality of chip formation regions 44, each having a second wiring layer 23, is prepared. The semiconductor wafer 45 is an assembly of semiconductor substrates 14 prior to being diced and the respective chip formation regions 44 are separated into the semiconductor substrates 14 by dicing. Next, the insulating film 16 is formed, for example, by the CVD method on an entirety of the semiconductor wafer 45 so as to cover the second wiring layers 23 (step S1).

Figure 11B:
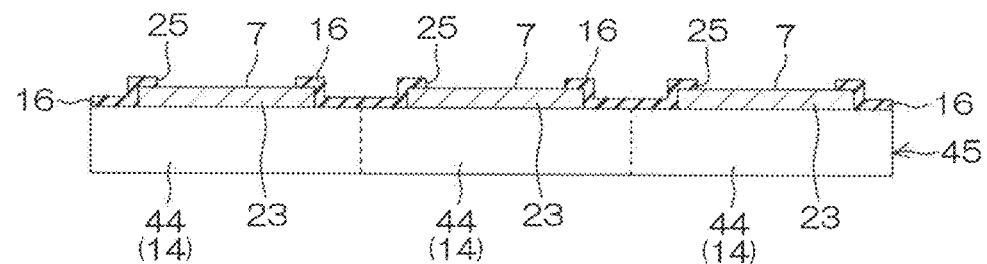

Next, as shown in FIG. 11B, the insulating film 16 is dry-etched selectively to form the pad openings 25 (step S2). A portion of each second wiring layer 23 is thereby exposed as a pad 7.

Figure 11C:
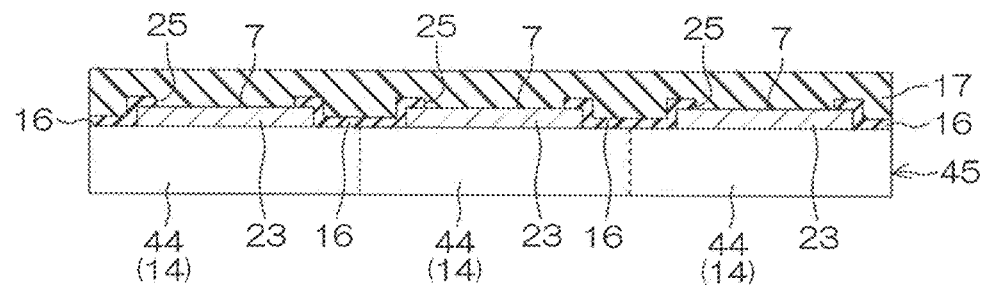

Next, as shown in FIG. 11C, the front surface protection film 17 is formed on the insulating film 16, for example, by a spin coating method (step S3).

Figure 11D:
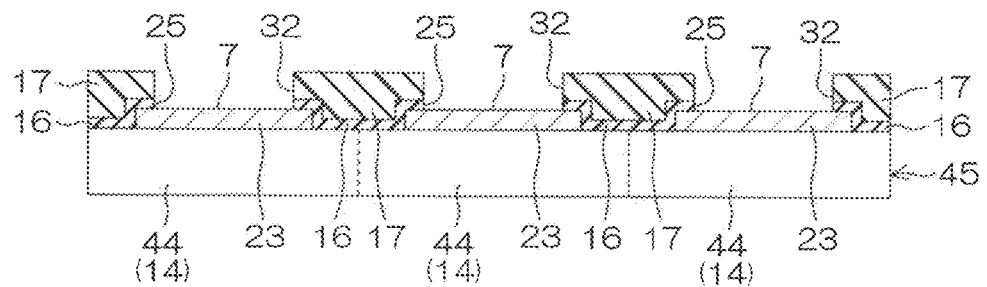

Next, as shown in FIG. 11D, the front surface protection film 17 is dry-etched selectively to form the second pad openings 32 (step S4). Although in FIG. 11D, the second pad openings 32 are formed so that the outer edges 33 and the outer edges 26 are matched (see FIG. 4), the front surface protection film 17 (polyimide) may shrink during baking of the film. Therefore, the front surface protection film 17 may ultimately have a structure, where, as shown in FIG. 5 to FIG. 7, the outer edge 33 of the second pad opening 32 is receded with respect to the outer edge 26 of the pad opening 25.

Figure 11E:
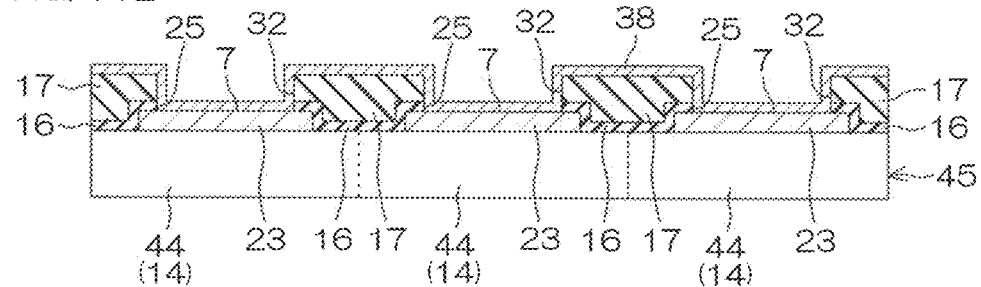

Next, as shown in FIG. 11E, the seed layer 38 is formed, for example, by a sputtering method on the entirety of the semiconductor wafer 45 so as to cover the plurality of chip formation regions 44 altogether (step S5).

Figure 11F:
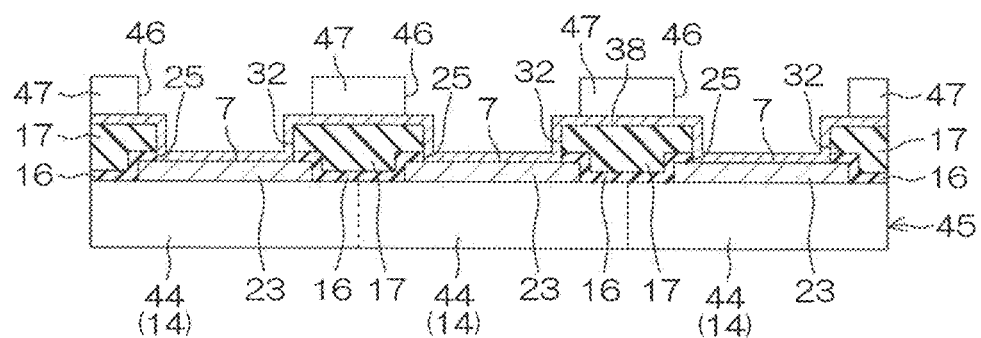

Next, as shown in FIG. 11F, a mask 47, having openings 46 at regions at which the plating layers 39 are to be formed, is formed on the seed layer 38 (step S6).

Figure 11G:
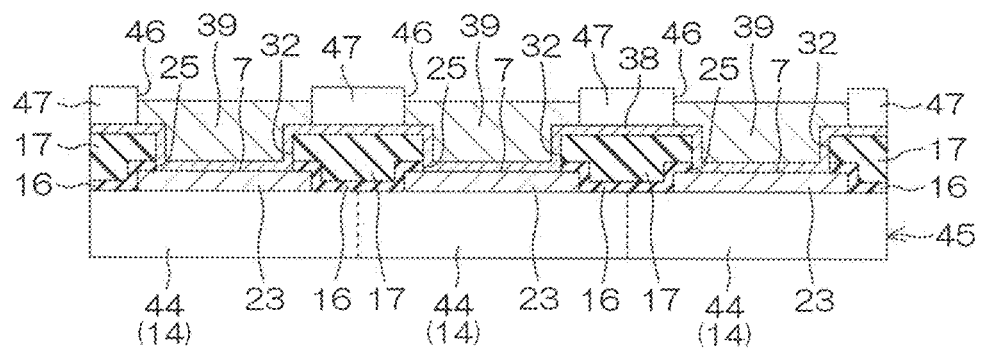

Next, as shown in FIG. 11G, the plating layers 39 are grown by electroplating from the seed layer 38 exposed from the openings 46 in the mask 47 (step S7).

Thereafter, a process of removing unnecessary portions of the seed layer 38, a process of cutting apart the plurality of chip formation regions 44 into individual pieces of the respective semiconductor chips 2, etc., are performed to obtain the semiconductor chips 2.

As described above, with each of the preferred embodiments, the plating layer 39 is formed by electroplating and therefore the cost required to form the plating layer 39 can be reduced. Also, there is no need to pretreat each pad 7, which is the object to be plated, prior to plating and therefore occurrence of a problem in the pad 7 can be prevented as well.

Figure 12:
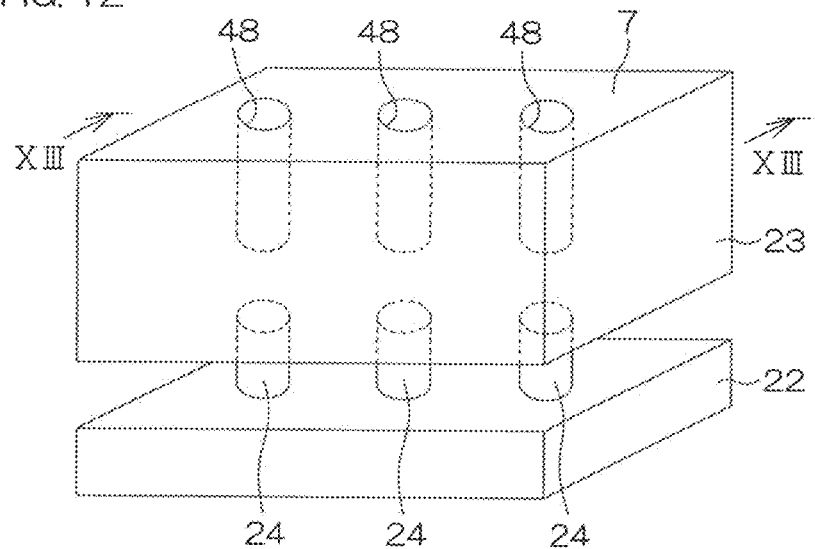
FIG. 12 is a diagram for describing a problem that occurs in a pad of the semiconductor chip.
Figure 13:
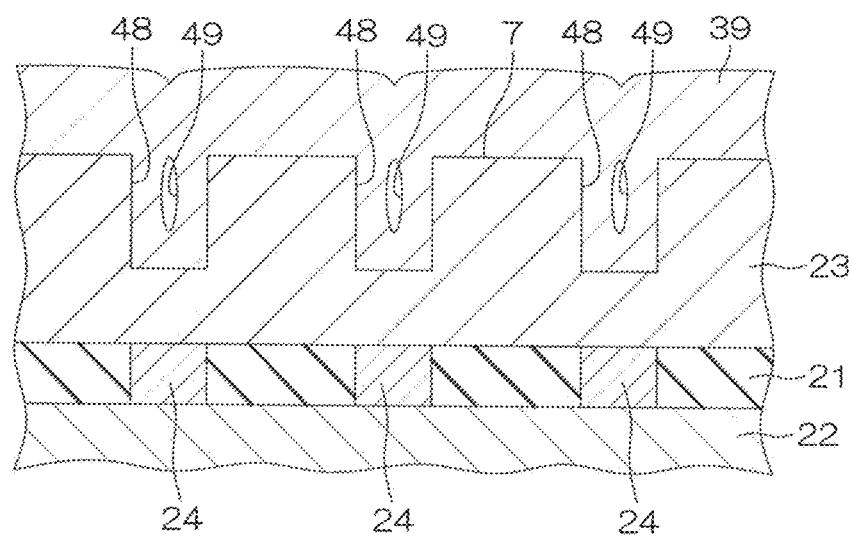
FIG. 13 is a diagram for describing the problem that occurs in the pad of the semiconductor chip.

As a problem that occurs in each pad 7, there is, for example, that which is shown in FIG. 12 and FIG. 13. FIG. 12 and FIG. 13 are diagrams for describing a problem that occurs when the plating layer 39 is formed by electroless plating.

In electroless plating, a front surface of an object to be plated must be pretreated prior to plating. For example, in the case of Ni plating, a zincate treatment is performed in advance on the pads 7. When this treatment is performed, spikes 48 (micropores) form at positions directly above the vias 24 in each Al pad 7 as shown in FIG. 12. Consequently, as shown in FIG. 13, a plating metal may become joined together at opening end portions of the spikes 48 before the spikes 48 are refilled with the plating metal during plating growth so that hollow cavities 48 may form inside the spikes 48.

On the other hand, when electroplating is adopted as in the preferred embodiments of the present invention, the pretreatment of the pads 7 can be omitted and therefore the forming of spikes 48 and cavities 49 can be suppressed. Therefore, with the semiconductor device 1 described above, satisfactory conduction reliability of the pads 7 can be secured at low cost.

Figure 14:
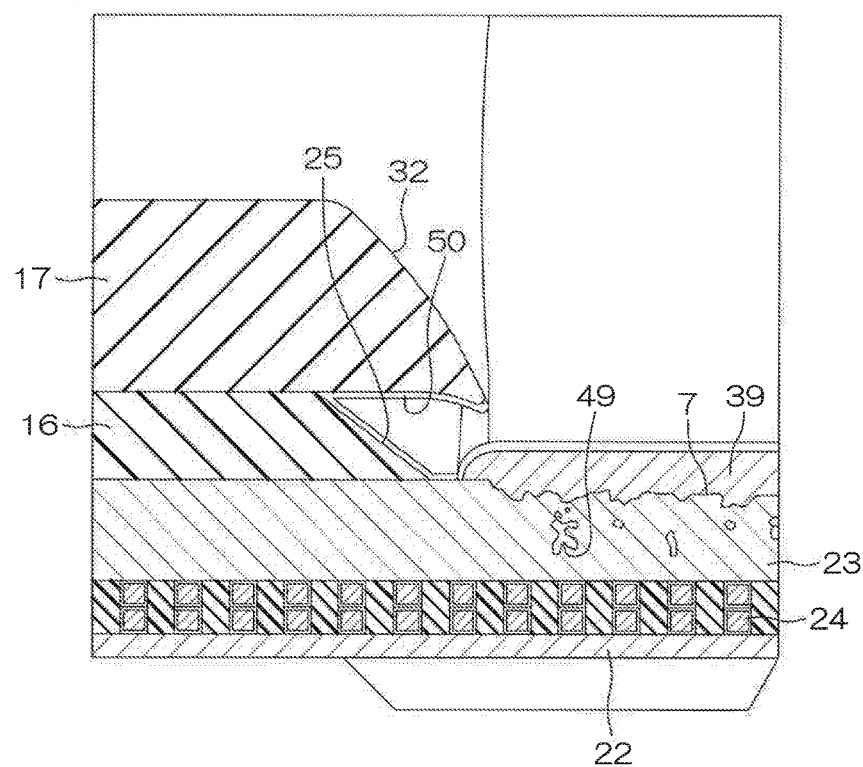
FIG. 14 is a diagram of a semiconductor chip having a plating layer formed by electroless plating.

Also, FIG. 14 is a diagram of a semiconductor chip having a plating layer formed by electroless plating. With the present semiconductor chip, the openings 25 and 32 in the insulating film 16 and the front surface protection film 17 are formed in the same etching process (isotropic etching). Therefore, as shown in FIG. 14, a void 50 is formed below the front surface protection film 17 due to lateral direction erosion during etching.

On the other hand, with the preferred embodiments of the present invention, the etching of the insulating film 16 (FIG. 11B) and the etching of the front surface protection film 17 (FIG. 11D) are performed in separate processes and therefore the forming of a hollow portion such as the void 50 in FIG. 14 can be suppressed.

Also, if, as in the structures of FIG. 7 to FIG. 9, the plating layer 39 is formed to a size that fits within the upper surface region of the second wiring layer 23, even when a crack, with the comparatively hard plating layer 39 (especially Ni) as a starting point, forms in the insulating film 16 or the front surface protection film 17, the crack can be blocked by the second wiring layer 23. Consequently, the crack can be prevented from reaching the semiconductor element 18 and causing a short circuit.

Further, if, as in the structures of FIG. 4 to FIG. 7, the outer edge 33 of the second pad opening 32 is matched with the outer edge 26 of the pad opening 25 (FIG. 4) or is receded with respect to the outer edge 26 (FIG. 5 to FIG. 7), the upper surface region of the plating layer 39 can be made comparatively wide. Consequently, a width of selection of a ball size in connecting each wire 5 can be increased.

Although preferred embodiments of the present invention have been described above, the present invention may also be implemented in yet other modes.

For example, although a QFN type semiconductor device was taken up for the preferred embodiments described above, the present invention may be applied to a semiconductor device of another package type, such as an SON (Small Outline Non-leaded package), a QFP (Quad Flat Package), or an SOP (Small Outline Package), etc.

The semiconductor device according to the present invention may be used generally in the manufacture of power devices, such as power modules, etc., and can be applied satisfactorily especially in fields in which compact size and lightweight are required and to devices used under environments of severe temperature change, such as devices for onboard use, solar cells, industrial equipment, etc.

Besides the above, various design modifications may be made within the scope of the matters described in the claims.

What is claimed is:

1. A semiconductor device comprising:
a semiconductor substrate with a wiring layer formed thereon;
an insulating film formed on the semiconductor substrate so as to cover the wiring layer and having a first pad opening exposing a portion of the wiring layer as a pad;
a front surface protection film formed on the insulating film and being constituted of an insulating material differing from the insulating film and having a second pad opening securing exposure of at least a portion of the pad;
a seed layer formed on the pad; and
a plating layer formed on the seed layer, wherein
the insulating film has a step portion based on a height difference due to a thickness of the wiring layer,
the front surface protection film is formed to decrease in thickness in a direction approaching the wiring layer in a region above the step portion, and has a flat surface in the region above the step portion.

2. The semiconductor device according to claim 1, wherein an outer edge of the first pad opening and an outer edge of the second pad opening are matched at top and bottom corners respectively as seen in a vertical cross-sectional view.

3. The semiconductor device according to claim 1, wherein an outer edge of the second pad opening is disposed further inward than an outer edge of the first pad opening so that a side surface of the first pad opening is covered by the front surface protection film.

4. The semiconductor device according to claim 3, wherein the plating layer is disposed on a second pad peripheral edge portion, which is constituted of a portion of an upper surface of the front surface protection film.

5. The semiconductor device according to claim 3, wherein the plating layer is disposed in an inner region of the second pad opening and across an interval from the outer edge of the second pad opening.

6. The semiconductor device according to claim 1, wherein the plating layer is formed to a size fitting within an upper surface region of the wiring layer.

7. The semiconductor device according to claim 1, wherein the wiring layer includes an Al wiring layer.

8. The semiconductor device according to claim 1, wherein the insulating film includes a silicon nitride film and the front surface protection film includes a polyimide film.

9. The semiconductor device according to claim 1, wherein the plating layer includes a laminated structure constituted of Ni and Pd on the Ni.

10. The semiconductor device according to claim 1, further comprising a wire connected to the pad and constituted of a metal material containing Cu as a main component.

11. A semiconductor device, comprising:
a semiconductor substrate with a wiring layer formed thereon;
an insulating film formed on the semiconductor substrate so as to cover the wiring layer and having a first pad opening exposing a portion of the wiring layer as a pad;

a front surface protection film formed on the insulating film and being constituted of an insulating material differing from the insulating film and having a second pad opening securing exposure of at least a portion of the pad;

a seed layer formed on the pad; and a plating layer formed on the seed layer, wherein an outer edge of the second pad opening is disposed further outward than an outer edge of the first pad opening in a horizontal direction with respect to the first pad opening, a pad peripheral edge portion, constituted of a portion of an upper surface of the insulating film, is exposed between the outer edge of the first pad opening and the outer edge of the second pad opening, and the plating layer is disposed on a portion of the pad peripheral edge portion.

12. The semiconductor device according to claim 11, wherein the plating layer is disposed in an inner region of the second pad opening and across an interval from the outer edge of the second pad opening.

13. The semiconductor device according to claim 11, wherein the plating layer is disposed continuously on the pad peripheral edge portion and a second pad peripheral edge portion, which is constituted of a portion of an upper surface of the front surface protection film.

* * * * *